United States Patent
Starr (10) Patent No.: US 7,180,334 B2
(45) Date of Patent: Feb. 20, 2007

(54) APPARATUS AND METHOD FOR DECREASING THE LOCK TIME OF A LOCK LOOP CIRCUIT

(75) Inventor: Gregory Starr, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/407,632

(22) Filed: Apr. 3, 2003

(65) Prior Publication Data

US 2004/0239385 A1 Dec. 2, 2004

(51) Int. Cl.
*H03L 7/06* (2006.01)

(52) U.S. Cl. .................. 326/156; 156/159; 331/16; 331/17

(58) Field of Classification Search ........ 327/156–160; 337/10, 16, 17
See application file for complete search history.

(56) References Cited

U.S. PATENT DOCUMENTS

| | | | |
|---|---|---|---|
| 4,584,539 A | 4/1986 | Stankey | |
| 5,124,671 A | 6/1992 | Srivastava | |
| 5,367,269 A | 11/1994 | Yanagidaira et al. | |
| 5,648,744 A * | 7/1997 | Prakash et al. | ............... 311/11 |
| 5,686,864 A | 11/1997 | Martin et al. | |
| 5,739,730 A * | 4/1998 | Rotzoll | ................... 331/177 V |
| 6,091,304 A * | 7/2000 | Harrer | ......................... 331/10 |
| 6,218,876 B1 * | 4/2001 | Sung et al. | ................. 327/156 |
| 2002/0001361 A1 | 1/2002 | Ueno et al. | |
| 2002/0118074 A1 | 8/2002 | Jovenin | |

FOREIGN PATENT DOCUMENTS

| | | |
|---|---|---|
| EP | 0599505 A1 | 6/1991 |
| WO | WO 04/001975 A1 | 12/2003 |

* cited by examiner

*Primary Examiner*—Timothy P. Callahan
*Assistant Examiner*—An T. Luu
(74) *Attorney, Agent, or Firm*—Townsend and Townsend and Crew LLP (57) ABSTRACT

Method and apparatus for locking a phase lock loop, where the method includes selecting a frequency window corresponding to a VCO output frequency, selecting a control voltage corresponding to the frequency window and providing the control voltage to the control voltage circuit which subsequently uses the selected control voltage as the starting control voltage of the phase lock loop.

39 Claims, 7 Drawing Sheets

APPARATUS AND METHOD FOR DECREASING THE LOCK TIME OF A LOCK LOOP CIRCUIT

BACKGROUND OF THE INVENTION

This invention relates to phase-locked loop circuits for programmable logic devices. More particularly, this invention relates to an apparatus and method for decreasing the lock time of a phase-locked loop over a wide range of frequencies.

Programmable logic devices include phase-locked loop ("PLL") or delayed-lock loop ("DLL") circuitry to counteract "skew" and excessive delay in clock signals propagating on the device. See for example, Jefferson U.S. Pat. No. 5,699,020 and Reddy et al. U.S. Pat. No. 5,847,617, both of which are incorporated herein by reference.

PLL circuits include circuitry to generate an oscillating signal that is phase/frequency locked with a reference clock. The oscillating signal is controlled and maintained in response to a control voltage, which is generated and maintained by the circuitry of the PLL. When a PLL is powered up, the control voltage is set to a predetermined value. The PLL then adjusts the control voltage up or down depending on the desired output frequency of the PLL. After reaching the desired output frequency, the PLL further continues to make fine adjustments to the control voltage until the output signal is in phase with the reference signal. Once the control voltage reaches a value where the desired output phase/frequency is achieved, the PLL is locked. And thereafter the PLL circuitry maintains that control voltage.

Normal operations on an electronic device such as a programmable logic device, are generally not available until the PLL is locked with the reference signal. Thus, it is desirable to reduce the amount of time required for the PLL to lock.

Existing methods reduce the lock time of a PLL circuit by setting the starting voltage of the PLL to ½ Vcc. Where a user setting requires the control voltage to be something other than ½ Vcc, the PLL starts at ½ Vcc and then the PLL circuitry adjusts the control voltage up or down until the control voltage reaches the desired value. Again, normal operations on the electronic device are not available while the PLL circuitry makes this adjustment.

Although the above technique reduces the PLL lock time, it is unsatisfactory where the PLL must operate over a wide range of frequencies. Consequently, there is a need in the art for a method and apparatus to reduce the lock time of a PLL where the PLL must operate over a wide range of frequencies.

SUMMARY OF THE INVENTION

The present invention discloses a method and apparatus for reducing the lock time of a PLL circuit over a wide range of frequencies. The method of the present invention determines the starting control voltage of the PLL based on the desired output frequency where the starting control voltage corresponds to a range of frequencies that include the desired output frequency.

In a method of the present invention, the PLL operating frequency range is parsed into a plurality of non-overlapping frequency windows. Each frequency window is then mapped to a starting control voltage. When a user provides a desired output frequency, the frequency window containing the desired output frequency is determined. Then the starting control voltage corresponding to the frequency window is selected as the starting control voltage of the PLL. The PLL circuitry then adjusts the control voltage up or down until the control voltage corresponding to the desired output frequency is reached. The PLL circuitry then proceeds to establish a phase lock for the PLL.

The present invention also includes a control voltage circuit for providing the starting control voltage to the phase locked loop circuit in accordance with the invention. The control voltage circuit comprises a plurality of up and down legs that are enabled or disabled using logic gates. Depending on the desired output voltage, each leg of the control voltage circuit can be enable or disabled. By enable one up leg, the control voltage is incremented by a value delta. By enabling a second up leg, the control voltage value is enabled by another delta. Thus the control voltage can be incrementally increased or decreased by enabling the appropriate number of up or down legs.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
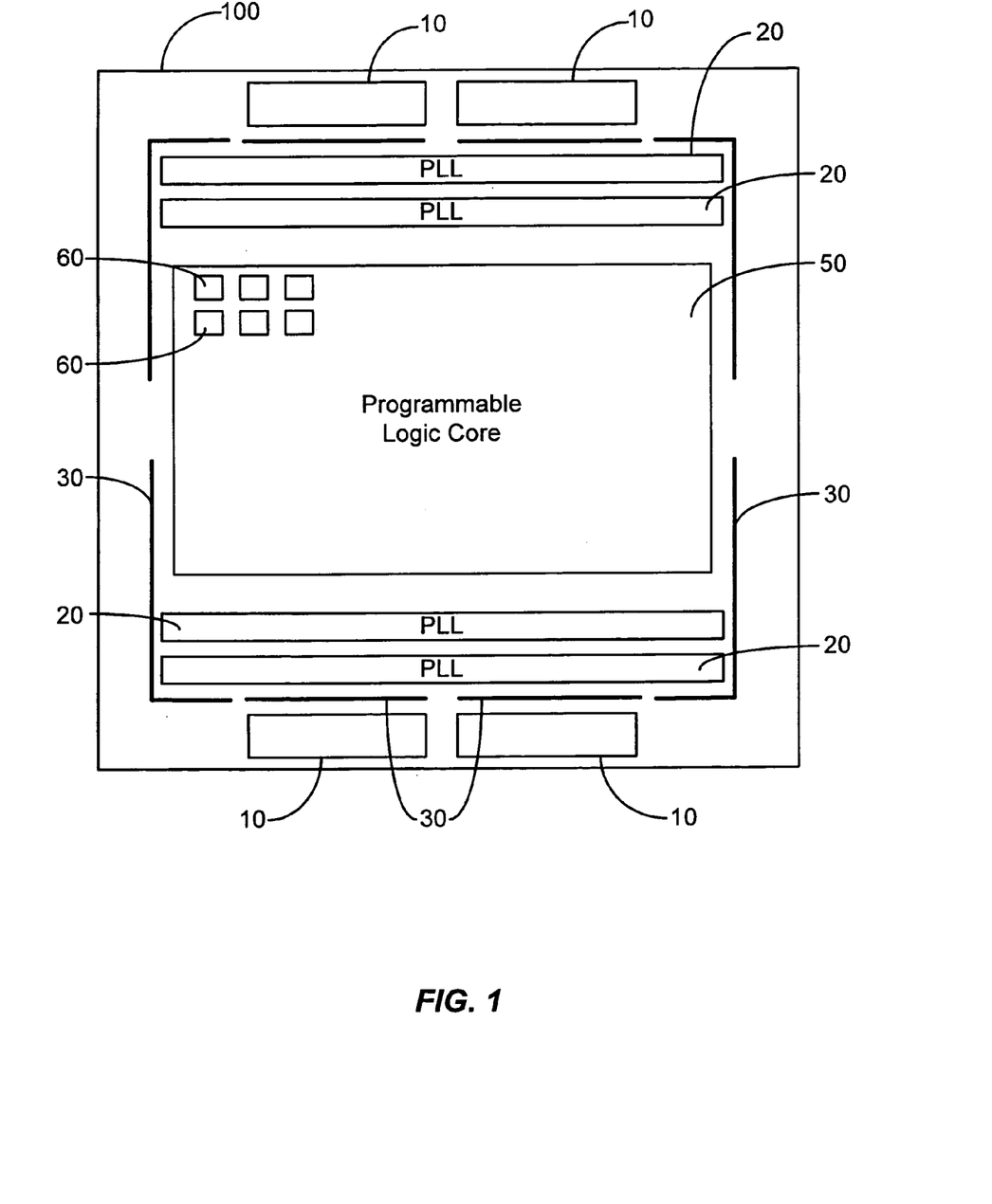
FIG. 1 shows a schematic overview of a programmable logic device 100 incorporating the present invention.

FIG. 1 shows a schematic overview of a programmable logic device 100 incorporating the present invention. Device 100 includes Input/Output elements 10, phase-locked loop circuit 20, power bus segments 30, and programmable logic core 50. Power bus segments 30 supply power to the various components of the programmable logic device 100. Input/Output elements 10 transmit information to and from the programmable logic device to other devices in the system. Phase-locked loop circuits 20 are used in conjunction with other circuitry on programmable logic device 100.

Programmable logic core 50 includes a plurality of logic elements 60 disposed on the device in a two-dimensional array of intersecting rows and columns of such regions. Logic elements 60 include programmable registers, preferably flip-flops. Logic elements 60 may further include look-up tables or universal logic blocks, pterms, carry and cascade chains and other circuitry to perform various functions of the programmable logic device. In some embodiments, a plurality of logic elements in the array may be grouped to form logic array blocks.

Although the present invention is described using a programmable logic device, the invention may be used on other integrated circuit devices that use a phase-locked loop or delay locked loop such as application specific integrated circuits (ASICs) or application specific standard parts (ASSPs) or the like.

Figure 2:
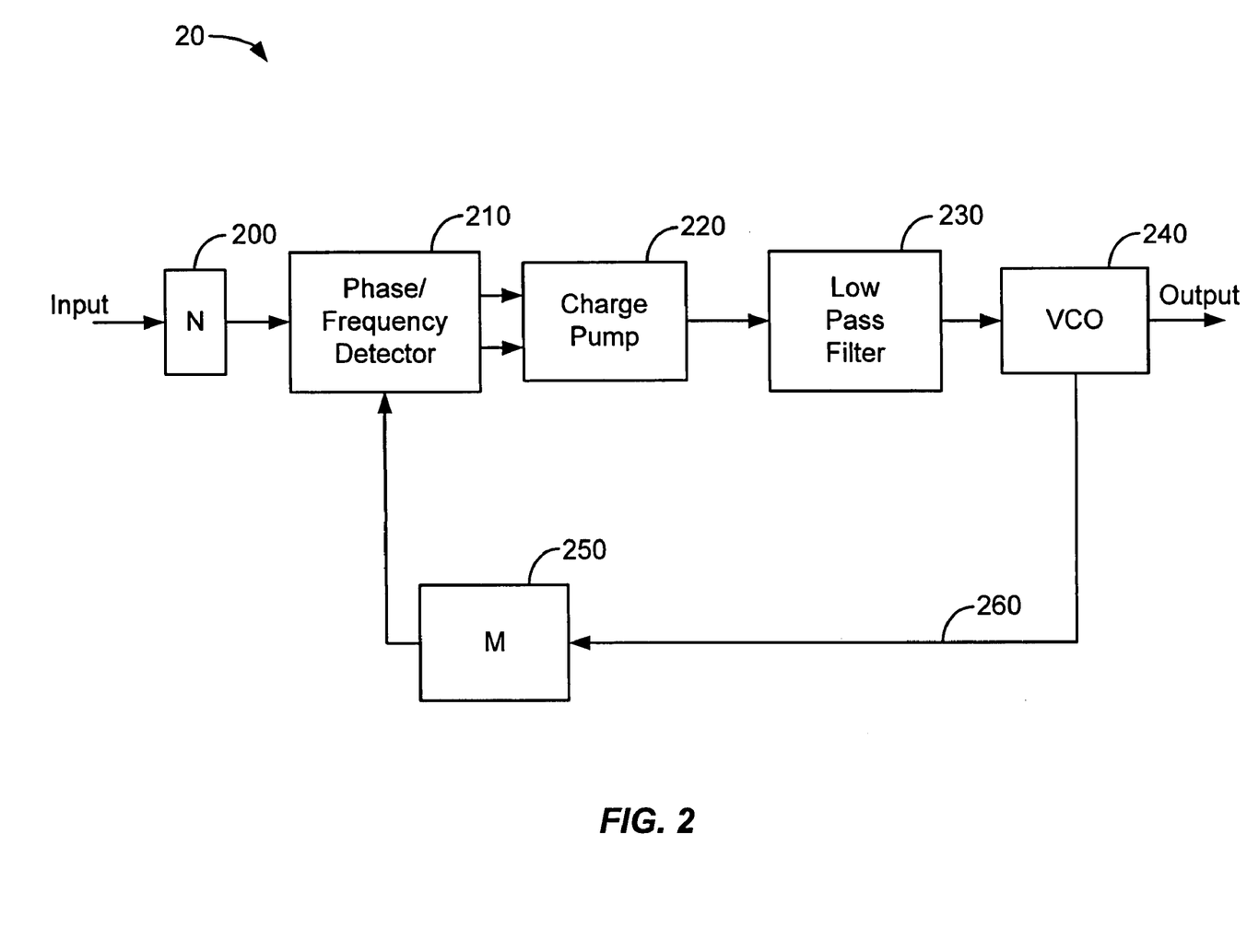
FIG. 2 shows an exemplary PLL circuit 20 that may be used in conjunction with the present invention.

FIG. 2 shows an exemplary PLL circuit 20 that may be used in conjunction with the present invention. Circuit 10 includes an input counter 200, phase/frequency detector 210, a charge pump circuit 220, a low pass filter 230, a feedback counter 250 and a voltage controlled oscillator 240.

Input counter 200 divides the input frequency by a predetermined integer value prior to sending the signal to phase/frequency detector 210. The phase/frequency detector 210 compares the relative phases and frequencies of a reference clock signal and a feed-back clock signal that the loop circuit 260 feeds back to the phase/frequency detector 210. If the phase of the feed-back clock signal is behind the phase of the reference clock, the phase/frequency detector 210 produces a first type of output signal. If the phase of the feed-back clock signal is ahead of the phase of the reference clock signal, the phase/frequency detector 210 produces a second type of output signal.

The first and second output signals of the phase/frequency detector 210 are applied to a charge pump circuit 220, which charges or discharges the charge storing element of low-pass filter 230, depending on whether the phase/frequency detector 210 is producing the first or the second output signal. The output signal of the low-pass filter 230 is applied as a control signal to a voltage controlled oscillator 240.

The output signal of the voltage controlled oscillator 240 is the ultimately desired output of the phase lock loop circuit. The feedback clock signal is the output of the voltage controlled oscillator 240 divided by an value M at feedback counter 250 and fed back to the phase/frequency detector 210. Preferably, the M value is an integer value. In other embodiments, the M value may be a fraction.

The output frequency of the PLL is the output frequency of the VCO, $f_{vco}$, where $f_{vco}$ as a function of control voltage $V_{ctrl}$ is given by the following equation:

$$f_{VCO} = f_0 + K_{VCO}(V_{ctrl} - V_0).$$

Here, $f_o$ is the starting VCO frequency when the control voltage of the VCO is at ½ Vcc, $V_o$ is ½ Vcc, and $K_{vco}$ is the VCO gain. If the control voltage is set to something less than ½ Vcc, the VCO will run at a frequency lower than the starting VCO frequency $f_o$. If the control voltage is set to something higher than ½ Vcc, the VCO will run at a frequency higher than the starting VCO frequency $f_o$. Thus, it is possible to pick an appropriate scaling for the control voltage and set the starting control voltage closer to the final desired control voltage value if the VCO gain is known. The VCO gain is readily available from simulations. In this embodiment, the VCO frequency increases as the control voltage increases. In other embodiments, the VCO frequency decreases as the control voltage increases.

In one embodiment, the operating frequency range of the PLL is divided into a plurality of frequency windows. Each frequency window contains a non-overlapping range of frequencies and each frequency in the operating frequency range is included in a frequency window. When the PLL is to operate at a given frequency, that frequency is mapped to a frequency window. The frequency window is then mapped to a starting control voltage and that control voltage is subsequently used as the starting voltage of the PLL.

Figure 3:
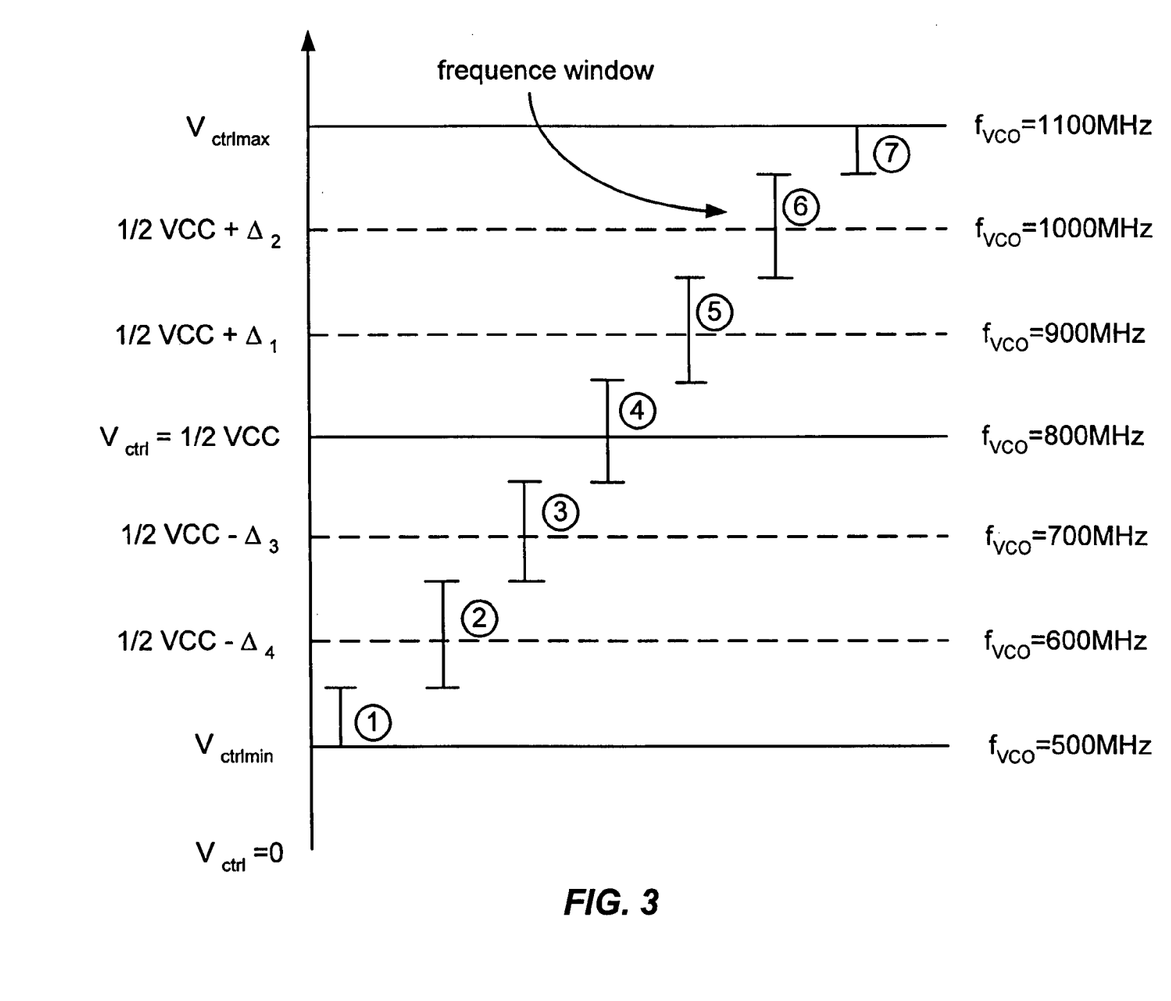
FIG. 3 illustrates the selection of a control voltage based on the desired output frequency.

FIG. 3 illustrates the selection of a control voltage based on the desired output frequency. The PLL of FIG. 3 operates over the frequency range of 500 MHz to 1100 MHz. The frequency range is divided into frequency windows 1 through 7. When a user provides a desired frequency, that frequency is mapped to one of the seven windows. A control voltage associated with that window is then used as the starting voltage of the VCO. The PLL circuitry then increases the control voltage if the desired output frequency is associated with a control voltage that is higher than the starting control voltage. Alternately, the PLL circuitry decreases the control voltage if the desired output frequency is associated with a control voltage that is lower than the starting control voltage.

For example, if the desired output frequency is 610 MHz, the selected frequency window is window 2. The starting control voltage of the PLL will then be ½ Vcc–$\Delta_4$. In this case, the starting control voltage is less than the control voltage associated with the desired output frequency. Thus, the PLL circuitry will adjust the control voltage upwards from the starting voltage of ½ Vcc–$\Delta_4$ until the VCO output frequency reaches 610 MHz. Similarly, if the desired output frequency is 1080 MHz, the selected frequency window is window 7. The starting control voltage of the PLL will then be $V_{ctrlmax}$. In this case, the starting control voltage is greater than the control voltage associated with the desired output frequency. So, the PLL circuitry will adjust the control voltage downwards until the VCO output frequency reaches 1080 MHz.

Figure 4:
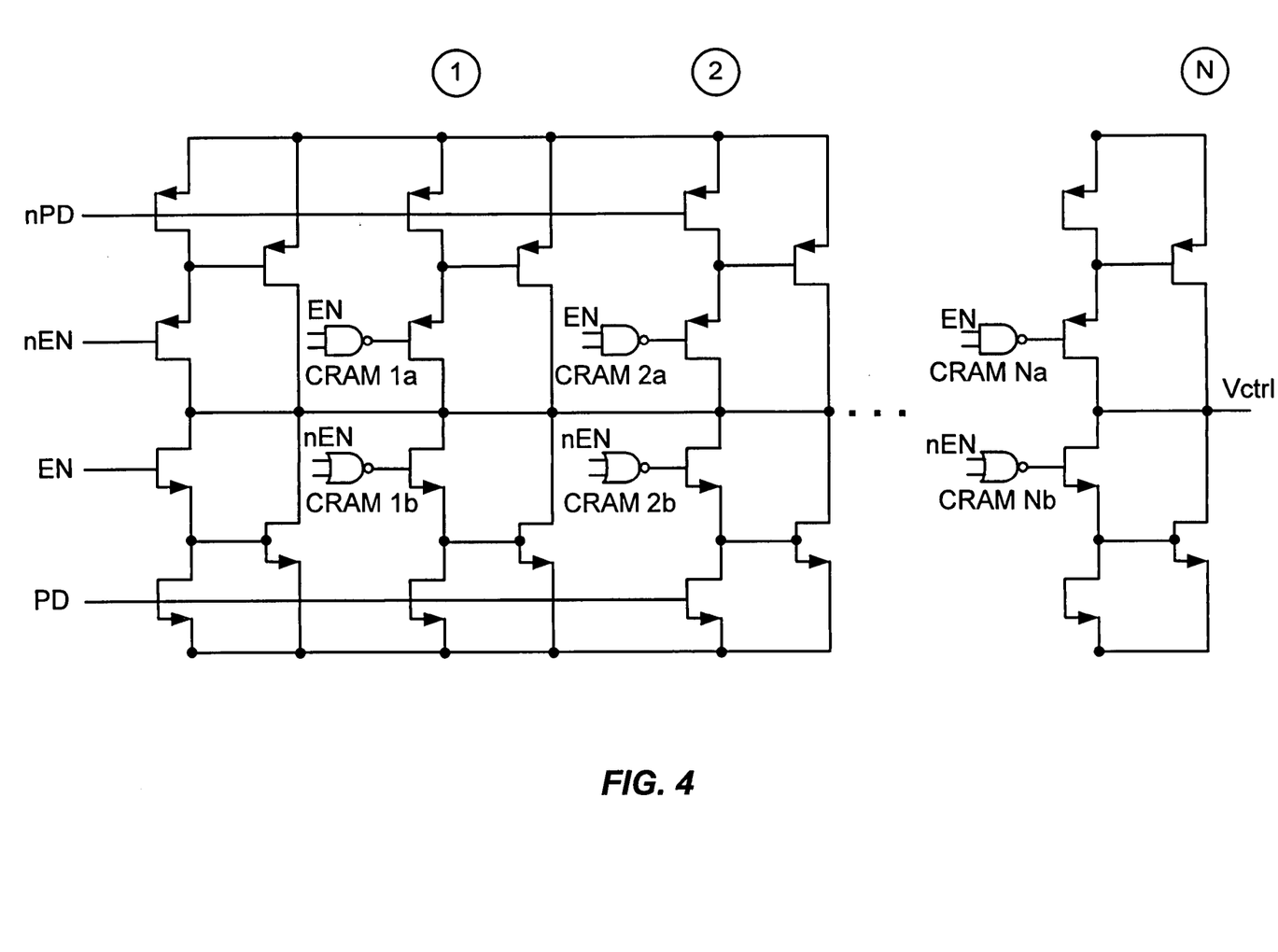
FIG. 4 is a diagram of a control voltage circuit that may be used to implement certain aspects of the present invention.

FIG. 4 is a diagram of a control voltage circuit that may be used to implement certain aspects of the present invention. The starting control voltage of the VCO is controlled by enabling or disabling selected legs of the control voltage circuit which are enabled using a respective series of logic gates or muxes. The CRAMs 1, 2, 3 . . . N can be programmed to be either ON or OFF. By controlling the EN and nEN signals in conjunction with the programmed CRAMs, the respective legs of the circuit can be enabled or disabled, thereby adjusting the starting control voltage of the PLL either up or down. The CRAM is programmed to be either ON or OFF during the configuration process for the PLD. CRAM can be implemented as an EPROM, EEPROM, fuse, anti-fuse, SRAM, MRAM, FRAM, DRAM or the like.

Preferably, if the CRAM 1a is programmed to be a OFF and the enable signal is high or low then the NAND gate 1a is disabled and that up leg is not turned on. In this instance the value of the starting control voltage is unchanged. If the CRAM 1a is programmed to be ON and the enable signal is low then the NAND gate is still disabled and again the starting control voltage is not adjusted. If the CRAM 1a is programmed to be ON and the enable signal is high then the NAND 1a gate is enabled and the corresponding leg 1a is turned on, thereby adjusting the starting control voltage upwards by a predetermined value Δ. If CRAM 2a is programmed to be ON and the enable signal to the NAND gate 2a is high, then circuit 2a is enabled and the value of the starting control voltage is increased by an additional Δ and so on.

Similarly, if the CRAM 1b is programmed to be ON and the nEN signal is high or low then the NOR gate 1b is disabled and that down leg is not turned on. In this instance the starting control voltage is unchanged. If the CRAM 1b is programmed to be OFF and the nEN signal is high then the NOR gate 1b is still disabled and again the starting control voltage remains unchanged. If the CRAM 1b is programmed to be OFF and the nEN signal is low then the NOR gate 1b is enabled and the corresponding leg 1b is turned on, thereby adjusting the starting control voltage downward by a predetermined value Δ. If CRAM 2b is programmed to be on then circuit 2b is enabled and the value of the starting control voltage is decreased by an additional Δ and so on.

The PD and nPD signal are used to enable or disable the circuit completely. Thus if PD is high then the PLL circuit is completely disabled. Else the PLL circuit is enabled and the signal passes through the PLL and is processed by the various component of the PLL.

Thus, the starting control voltage can be adjusted incrementally by enabling one or more of these circuits. Although, the preferred embodiment shows that the Δ values for each leg are the same, those skilled in the art will appreciate that the respective legs need not have the same delta values.

Although, the circuit of FIG. 4 shows N legs, those skilled in the art will appreciate that any number of legs may be used to set the starting control voltage. Additionally, in addition to the circuit of FIG. 4, any differential resistance circuit may be used to increase or decrease the starting control voltage of the voltage controlled oscillator.

Figure 5:
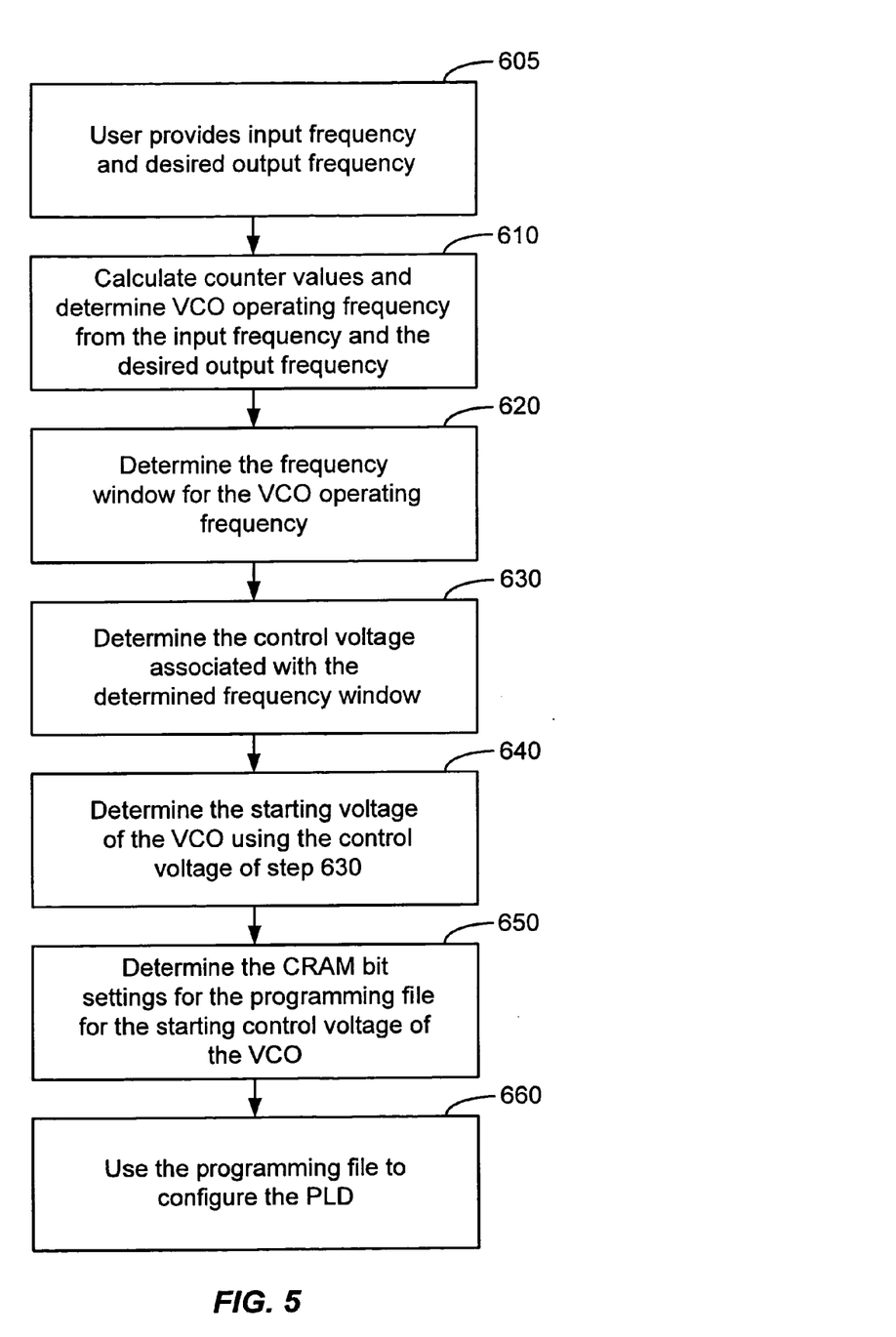
FIG. 5 illustrates a method that may be used to determine the starting control voltage of a PLL.

FIG. 5 illustrates a method that may be used to determine the starting control voltage of a PLL. In step 605, a user provides the input frequency and the desired output frequency for the PLL. From the input frequency, the output frequency of the VCO can be determined using the following equation:

$$f_{VCO} = \frac{M}{N} f_{in}$$

where M and N are the input counter and the feedback counter values, respectively and $f_{in}$ is the input frequency provided by the user. The M and N counter values are determined in step 610 using the input frequency and the desired output frequency provided by the user. Alternatively, the user may provide the M and N values which are subsequently used to calculate the output frequency of the VCO.

In step 620, after the output frequency of the VCO is determined, the desired output frequency is mapped to a frequency window. The frequency window may be determined by either using a database containing the frequency ranges and associated frequency windows. Once the frequency window is determined, the control voltage associated with the frequency window is determined in step 630. In one embodiment, the control voltage is determined by using a database containing the control voltages and associated frequency windows.

Once the control voltage is determined, the starting control voltage of the PLL is set to this control voltage in step 640. In step 650, the starting control voltage is then used to determine the CRAM bit settings for the programming file that is then used to configure the PLD in step 660.

Figure 6:
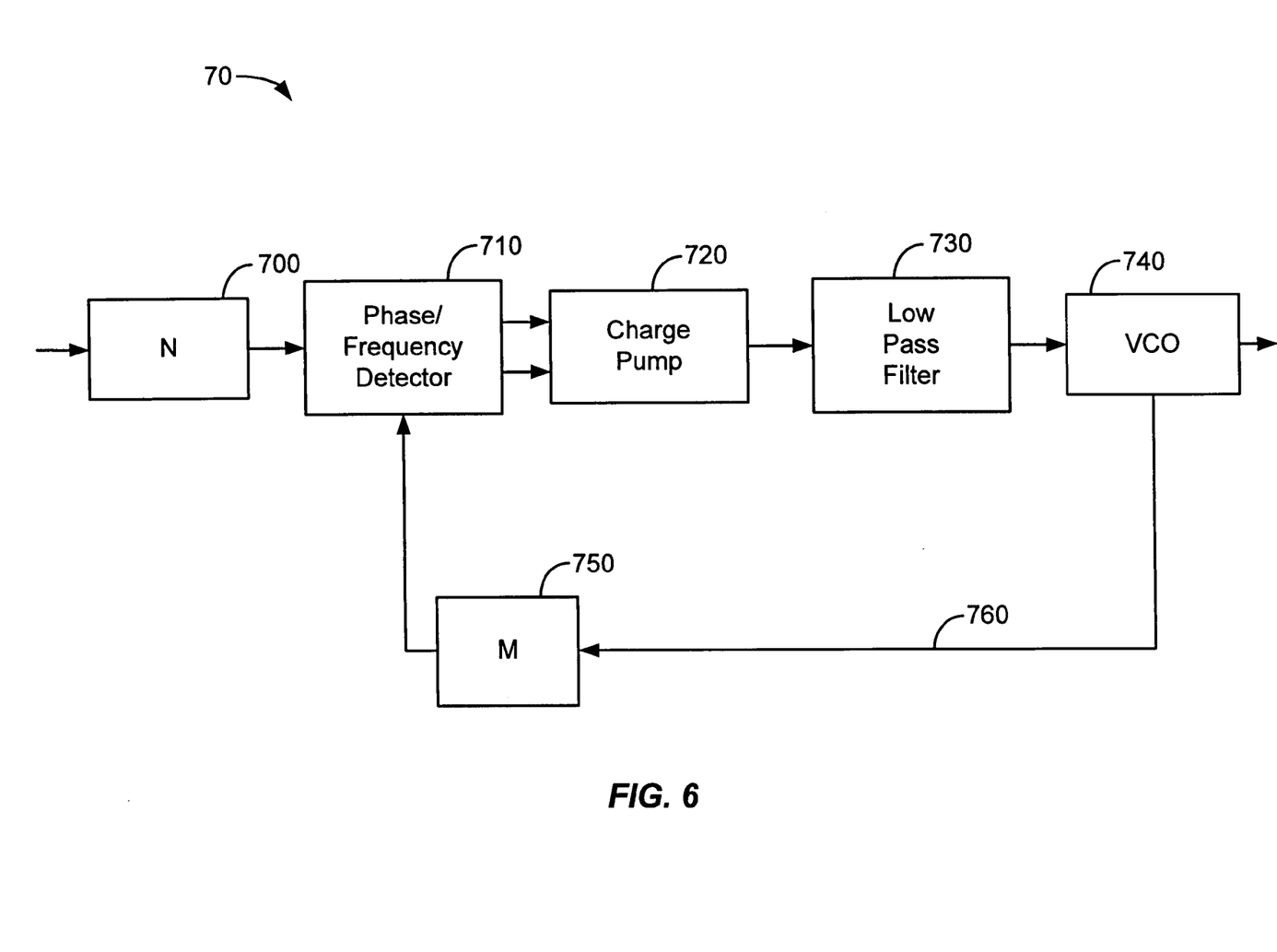
FIG. 6 shows an exemplary DLL circuit 70 that may be used in conjunction with the present invention.

The present invention may also be implemented in delay lock loop. FIG. 6 shows an exemplary DLL circuit 70 that may be used in conjunction with the present invention. Circuit 70 includes an input counter 700, phase/frequency detector 710, a charge pump circuit 720, a low pass filter 730, a feedback counter 750 and a voltage controlled delay chain 740.

Those skilled in the art will appreciate that the output voltage of the voltage controlled delay chain 740 of DLL 70 is controlled and adjusted in a manner similar to that described for controlling and adjusting the output voltage of the VCO for PLL 20 as described in FIGS. 2, 3, 4, and 5.

Figure 7:
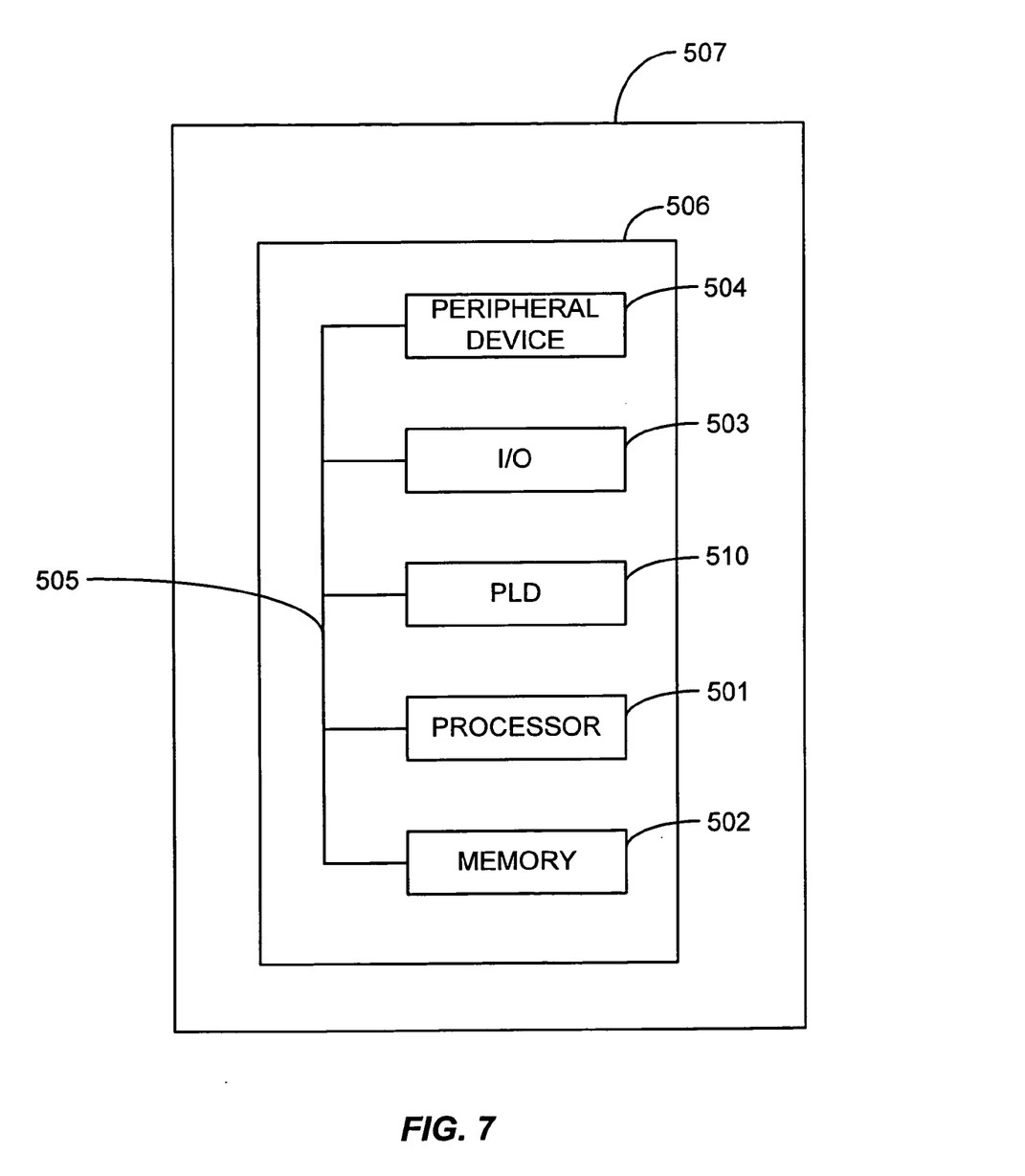
FIG. 7 illustrates a programmable logic device incorporating one or more PLL circuits of the present invention.

FIG. 7 illustrates a programmable logic device 510 incorporating one or more PLL circuits 520 configured according to this invention in a data processing system 500. Data processing system 500 may include one or more of the following components: a processor 501, memory 502, I/O circuitry 503, and peripheral devices 504. These components are coupled together by a system bus 505 and are populated on a circuit board 506 which is contained in an end-user system 507.

System 500 can be used in a wide variety of applications, such as computer networking, data networking, instrumentation, video processing, digital signal processing, or any other application where the advantage of using programmable or re-programmable logic is desirable. Programmable logic device 510 can be used to perform a variety of different logic functions.

For example, programmable logic device 510 can be configured as a processor or controller that works in cooperation with processor 501. Programmable logic device 510 may also be used as an arbiter for arbitrating access to a shared resource in system 500. In yet another example, programmable logic device 510 can be configured as an interface between processor 501 and one of the other components in system 500. It should be noted that system 500 is only exemplary, and that the true scope and spirit of the invention should be indicated by the following claims.

Although the present invention is described in the context of phase-locked loops, those skilled in that art will appreciate that the present invention may be used for any system where lock time is critical and where the system must operate over a wide range of frequencies.

What is claimed is:

1. A method of locking a loop circuit, comprising:
   determining a loop circuit frequency range of operation;
   dividing the frequency range of operation into a plurality of non-overlapping frequency windows, wherein each of the frequency windows are disposed adjacent to at least to one of the plurality of frequency windows, each frequency window containing a range of frequencies, wherein one of the frequencies within each respective frequency window is a starting frequency;
   selecting an output frequency of the loop circuit;
   selecting one of the frequency windows that includes the selected output frequency;
   determining a plurality of starting voltage levels of a loop control voltage as a function of voltage oscillator gain and the output frequency, wherein each of the starting voltage levels of the loop control voltage is configured to set a frequency output of a voltage-controlled oscillator to a respective starting frequency for the selected frequency window;
   prior to phase locking the loop, programming a voltage control circuit to generate the loop control voltage at a starting voltage level corresponding to the respective starting frequency;
   in response to logic states associated with a plurality of programmable control signals, programming the voltage control circuit to adjust the starting voltage level of the loop control voltage to the desired output frequency; and
   phase locking the loop with the adjusted loop control voltage.

2. The method of claim 1, wherein the plurality of programmable control signals are responsive to CRAM bits.

3. The method of claim 1, further comprising deactivating the loop control voltage in response to a deactivation logic state of the plurality of programmable control signals.

4. The method of claim 1, where the plurality of frequency windows comprise a common frequency bandwidth.

5. The method of claim 1, wherein a gain of the loop circuit in an open-loop state is configured such that a change in the loop control voltage at one starting frequency results in substantially the same change in frequency as substantially the same change in the loop control voltage at another starting frequency.

6. A phase-locked loop ("PLL") circuit comprising:
a voltage-controlled oscillator; and
a voltage-control circuit for providing a control voltage to the voltage-controlled oscillator, the provided control voltage being selected from a plurality of control voltages prior to operation of the phase-locked loop circuit by reference to a desired output frequency of the phase-locked loop circuit, wherein the provided control voltage is used as one of a plurality of starting voltages of the phase-locked loop circuit, wherein the plurality of control voltages are associated with the plurality of starting voltages, each of the plurality of starting voltages is associated with a starting frequency within a respective frequency window of a plurality of adjacent and non-overlapping frequency windows determined from the operational frequency of the phase-locked loop, wherein the desired output frequency is within one of the frequency windows, and wherein prior to locking the phase-locked loop, the voltage-control circuit is configured to set the provided control voltage to the starting control voltage to adjust the output of the voltage-controlled oscillator to a respective starting frequency, wherein in an open-loop state, and in response to logic signals coupled to the voltage-control circuit the voltage-control circuit adjusts the output frequency of the voltage-controlled oscillator from the respective starting frequency to the desired output frequency, or disables the control voltage to disable the output frequency of the voltage-controlled oscillator, and wherein in a closed-loop state, the provided control voltage is used to lock the phase-locked loop to the desired output frequency.

7. The PLL circuit of claim 6 wherein the voltage-control circuit comprises a plurality of first and second circuit elements responsive to the plurality of logic signals such that
when the first circuit element is enabled, the control voltage is increased; and
when the second circuit element is enabled, the control voltage is decreased.

8. The PLL circuit of claim 7 wherein the first and second circuit elements are one or more transistors coupled to a memory element and a logic element.

9. The PLL circuit of claim 8 wherein the memory element is an EPROM, EEPROM, fuse, anti-fuse, SPAM, MPAM, FPAM, or DRAM.

10. The PLL circuit of claim 8 wherein the logic element is a NAND gate, a NOR gate or a multiplexer.

11. The PLL circuit of claim 6 wherein each of the plurality of control voltages is associated with a frequency range.

12. The PLL circuit of claim 11 wherein each frequency in the frequency range is an output of the voltage-controlled oscillator.

13. The PLL circuit of claim 6 wherein the control voltage is provided to the voltage-controlled oscillator when the PLL is powered up.

14. The PLL circuit of claim 6 further comprising a frequency/phase detector, a charge pump and a loop filter.

15. The PLL circuit of claim 6 further comprising a feedback counter.

16. The PLL circuit of claim 6 further comprising an input counter and an output counter.

17. A programmable logic device including a phase-locked loop circuit, the phase-locked loop circuit comprising:
a voltage-controlled oscillator; and
a voltage-control circuit for providing a control voltage to the voltage-controlled oscillator, the provided control voltage being selected from a plurality of control voltages prior to operation of the phase-locked loop circuit by reference to a desired output frequency of the phase-locked loop circuit, wherein the provided control voltage is used as one of a plurality of starting voltages of the phase-locked loop circuit, wherein the plurality of control voltages are associated with the plurality starting voltages, each of the plurality of starting voltages associated with a starting frequency within a respective frequency window of a plurality of adjacent and non-overlapping frequency windows determined from the operational frequency of the phase-locked loop, wherein the desired output frequency is within one of the non-overlapping frequency windows, and wherein prior to locking the phase-locked loop, the voltage-control circuit is configured to set the provided control voltage to the starting control voltage to adjust the output of the voltage-controlled oscillator to a respective starting frequency, wherein in an open-loop state, and in response to logic signals coupled to the voltage-control circuit, the voltage-control circuit adjusts the output frequency of the voltage-controlled oscillator from the respective starting frequency to the desired output frequency, or disables the control voltage to disable the output frequency of the voltage-controlled oscillator, and wherein in a closed-loop state, the provided control voltage is used to lock the phase-locked loop to the desired output frequency.

18. A data processing system comprising:
processing circuitry;
a memory coupled to the processing circuitry;
a programmable logic device coupled to the processing circuitry and the memory, the programmable logic device comprising a phase-locked loop circuit, the phase-locked loop circuit comprising;
a voltage-controlled oscillator; and
a voltage-control circuit for providing a control voltage to the voltage-controlled oscillator, the provided control voltage being selected from a plurality of control voltages prior to operation of the phase-locked loop circuit by reference to a desired output frequency of the phase-locked loop circuit, wherein the provided control voltage is used as one of a plurality of starting voltages of the phase-locked loop circuit, wherein the plurality of control voltages are associated with the plurality starting voltages, each of the plurality of starting voltages associated with a starting frequency within a respective frequency window of a plurality of adjacent and non-overlapping frequency windows determined from the operational frequency of the phase-locked loop, wherein the desired output frequency is within one of the non-overlapping frequency windows, and wherein prior to locking the phase-locked loop, the voltage-control circuit is configured to set the provided control voltage to the starting control to adjust the output of the voltage-controlled oscillator to a respective starting frequency, wherein in an open-loop state, and in response to logic signals coupled to the voltage-control circuit, the voltage-control circuit adjusts the output frequency of the voltage-controlled oscillator from the respective starting frequency to the desired output frequency, or disables the control voltage to disable the output frequency of the voltage-controlled oscillator, and wherein in a closed-loop states the provided control voltage is used to lock the phase-locked loop to to desired output frequency.

19. A printed circuit board on which is mounted a programmable logic device comprising a phase-locked loop circuit, the phase-locked loop circuit comprising:
   a voltage-controlled oscillator; and
   a voltage-control circuit for providing a control voltage to the voltage-controlled oscillator, the provided control voltage being selected from a plurality of control voltages prior to operation of the phase-locked loop circuit by reference to a desired output frequency of the phase-locked loop circuit wherein the provided control voltage is used as one of a plurality of starting voltages of the phase-locked loop circuit, wherein the plurality of control voltages are associated with the plurality starting voltages, each of the plurality of starting voltages associated with a starting frequency within a respective frequency window of a plurality of adjacent and non-overlapping frequency windows determined from the operational frequency of the phase-locked loop, wherein the desired output frequency is within one of the non-overlapping frequency windows, and wherein prior to locking the phase-locked loop, the voltage-control circuit is configured to set the provided control voltage to the starting control voltage to adjust the output of the voltage-controlled oscillator to a respective starting frequency, wherein in an open-loop state, and in response to logic signals coupled to the voltage-control circuit, the voltage-control circuit adjusts the output frequency of the voltage-controlled oscillator from the respective starting frequency to the desired output frequency, or disables the control voltage to disable the output frequency of the voltage-controlled oscillator, and wherein in a closed-loop state and wherein the provided control voltage is used to lock the phase-locked loop to the desired output frequency.

20. The printed circuit board of claim 19 further comprising a processing circuitry coupled to the programmable logic device.

21. The printed circuit board of claim 20 further comprising a memory coupled to the processing circuitry and to the programmable logic device.

22. A delay-locked loop ("DLL") circuit comprising:
   a voltage-controlled delay chain; and
   a voltage-control circuit for providing a control voltage to the voltage-controlled delay chain, the provided control voltage being selected from a plurality of control voltages prior to operation of the delay-locked loop circuit by reference to a desired output frequency of the delay-locked loop circuit, wherein the provided control voltage is used as one of a plurality of starting voltages of the delay-locked loop circuit, wherein the plurality of control voltages are associated with the plurality starting voltages, each of the plurality of starting voltages associated with a starting frequency within a respective frequency window of a plurality of non-overlapping frequency windows determined from the operational frequency of the delay-locked loop, wherein the desired output frequency is within one of the non-overlapping frequency windows, and wherein prior to locking the delay-locked loop, the voltage-control circuit is configured to set the provided control voltage to the starting control voltage to adjust the output frequency of the delay-locked loop circuit to a respective starting frequency, wherein in an open-loop state, and in response to logic signals coupled to the voltage-control circuit, the voltage-control circuit adjusts the output frequency of the delay-locked loop circuit from the respective starting frequency to the desired output frequency, or disables the control voltage to disable the output frequency of the delay-locked loop circuit, wherein in a closed-loop state, the provided control voltage is used to lock the delay-locked loop to the desired output frequency.

23. The DLL circuit of claim 22 wherein the voltage-control circuit comprises a plurality of first and second circuit elements responsive to the logic signals such that when the first circuit element is enabled, the control voltage is increased; and
   when the second circuit element is enabled, the control voltage is decreased.

24. The DLL circuit of claim 23 wherein the first and second circuit elements are one or more transistors coupled to a memory element and a logic element.

25. The DLL circuit of claim 24 wherein the memory element is an EPROM, EEPROM, fuse, anti-fuse, SRAM, MRAM, FPAM, or DRAM.

26. The DLL. circuit of claim 24 wherein the logic element is a NAND gate, a NOR gate or a multiplexer.

27. The DLL circuit of claim 22 wherein each of the plurality of control voltages is associated with a frequency range.

28. The DLL circuit of claim 27 wherein each frequency in the frequency range is an output of the voltage-controlled delay chain.

29. The DLL circuit of claim 22 wherein the control voltage is provided to the voltage-controlled delay chain when the DLL is powered up.

30. The DLL circuit of claim 22 further comprising a frequency/phase detector, a charge pump and a loop filter.

31. The DLL circuit of claim 22 further comprising a feedback counter.

32. The DLL circuit of claim 22 further comprising an input counter and an output counter.

33. A programmable logic device including a delay-locked loop circuit, the delay-locked loop circuit comprising:
   a voltage-controlled delay chain; and
   a voltage-control circuit for providing a control voltage to the voltage-controlled delay chain, the provided control voltage being selected from a plurality of control voltages prior to operation of the delay-locked loop circuit by reference to a desired output frequency of the delay-locked loop circuit, wherein the provided control voltage is used as one of a plurality of starting voltages of the delay-locked loop circuit, wherein the plurality of control voltages are associated with the plurality starting voltages, each of the plurality of starting voltages associated with a starting frequency within a respective frequency window of a plurality of non-overlapping frequency windows determined from the operational frequency of the delay-locked loop circuit, wherein the desired output frequency is within one of the non-overlapping frequency windows, and wherein prior to locking the delay-lock loop circuit, the voltage-control circuit is configured to set the provided control voltage to the starting control voltage to adjust the output frequency of the delay-locked loop circuit to a respective starting frequency, wherein in an open-loop state, and in response to logic signals coupled to the voltage-control circuit, the voltage-control circuit adjusts the output frequency of the delay-locked loop circuit from the respective starting frequency to the desired output frequency, or disables the control voltage to disable the output frequency of the delay-locked loop circuit, and wherein in a closed-loop state the provided control voltage is used to lock the delay-locked loop circuit to the desired output frequency.

34. A data processing system comprising:
processing circuitry;
a memory coupled to the processing circuitry;
a programmable logic device coupled to the processing circuitry and the memory, the programmable logic device comprising a delay-locked loop circuit, the delay-locked loop circuit comprising;
a voltage-controlled delay chain; and
a voltage-control for providing a control voltage to the voltage-controlled delay chain, the provided control voltage being selected from a plurality of control voltages prior to operation of the delay-locked loop circuit by reference to a desired output frequency of the delay-locked loop circuit1 wherein the provided control voltage is used as one of a plurality of starting voltages of the delay-locked loop circuit, wherein the plurality of control voltages are associated with the plurality starting voltages, each of the plurality of starting voltages associated with a starting frequency within a respective frequency window of a plurality of non-overlapping frequency windows determined from the operational frequency of the delay-locked loop circuit, wherein the desired output frequency is within one of the non-overlapping frequency windows, and wherein prior to locking the delay-lock loop circuit, the voltage-control circuit is configured to set the provided control voltage to the starting control voltage to adjust the output frequency of the delay-locked loop circuit to a respective starting frequency, wherein in an open-loop state, and in response to logic signals coupled to the voltage-control circuit, the voltage-control circuit adjusts the output frequency of the delay-locked loop circuit from the respective starting frequency to the desired output frequency, or disables the control voltage to disable the output frequency of the delay-locked loop circuit, and wherein in a closed-loop state, the provided control voltage is used to lock the delay-locked loop circuit to the desired output frequency.

35. A printed circuit board on which is mounted a programmable logic device comprising a delay-locked loop circuit, the delay-locked loop circuit comprising:
a voltage-controlled delay chain; and
a voltage-control circuit for providing a control voltage to the voltage-controlled delay chain, the provided control voltage being selected from a plurality of control voltages prior to operation of the delay-locked loop circuit by reference to a desired output frequency of the delay-locked loop circuit, wherein the provided control voltage is used as one of a plurality of starting voltages of the delay-locked loop circuit wherein the plurality of control voltages are associated with the plurality starting voltages, each of the plurality of starting voltages associated with a starting frequency within a respective frequency window of a plurality of non-overlapping frequency windows determined from the operational frequency of the delay-locked loop circuit, wherein the desired output frequency is within one of the non-overlapping frequency windows, and wherein prior to locking the delay-lock loop circuit, the voltage-control circuit is configured to set the provided control voltage to the starting control voltage to adjust the output frequency of the delay-locked loop circuit to a respective starting frequency, wherein in an open-loop state, and in response to logic signals coupled to the voltage-control circuit, the voltage-control circuit adjusts the output frequency of the delay-locked loop circuit from the respective starting frequency to the desired output frequency, or disables the control voltage to disable the output frequency of the delay-locked loop circuit, and wherein in a closed-loop state, the provided control voltage is used to lock the delay-locked loop circuit to the desired output frequency.

36. The printed circuit board of claim 35 further comprising a processing circuitry coupled to the programmable logic device.

37. The printed circuit board of claim 36 further comprising a memory coupled to the processing circuitry and to the programmable logic device.

38. A method for decreasing a lock time of a lock loop circuit included in a programmable logic device, comprising:
selecting a range of frequencies including a desired output frequency of the lock loop circuit;
parsing the range of frequencies into a plurality of adjacent non-overlapping frequency windows, wherein the desired output frequency is within one of the plurality of non-overlapping frequency windows;
determining a starting control voltage of the lock loop circuit, the starting control voltage corresponding to a starting frequency within the frequency window containing the desired output frequency;
in an open-loop state, programming the programmable logic device such that a control voltage of the lock loop circuit is set to the starting control voltage as the lock loop circuit is powered up to establish a starting frequency for the lock loop circuit;
programming the programmable logic device such that while in the open-loop state the starting control voltage is adjusted to move the starting frequency to within a predetermined range of the desired output frequency; and
in a closed-loop state, adjusting the control voltage as needed to lock the lock loop circuit to the desired output frequency.

39. A programmable logic device including a lock loop circuit, the lock loop circuit comprising:
a voltage-controlled oscillator;
a voltage-control circuit for providing a control voltage selected from a plurality of control voltages to the voltage-controlled oscillator, wherein in an open-loop state, the selected control voltage is set to a programmable starting control voltage which sets the voltage-controlled oscillator to a selected one of a plurality of starting frequencies as the lock loop circuit is powered up, and in response to logic signals coupled to the voltage-controlled circuit adjusts the programmable starting control voltage such that the selected starting frequency is adjusted as needed to obtain a desired output frequency of the lock loop circuit, the selected starting control voltage corresponding to a range of frequencies including the desired output frequency, wherein the plurality of control voltages are associated with a plurality of adjacent non-overlapping frequency windows determined from the operational frequency of the lock loop circuit, and wherein in a closed-loop state, the programmable starting control voltage is used to lock the lock loop circuit to the desired output frequency.

* * * * *

UNITED STATES PATENT AND TRADEMARK OFFICE
CERTIFICATE OF CORRECTION

PATENT NO. : 7,180,334 B2
APPLICATION NO. : 10/407632
DATED : February 20, 2007
INVENTOR(S) : Starr It is certified that error appears in the above-identified patent and that said Letters Patent is hereby corrected as shown below:

Column 7, line 33, between the words "circuit" and "the" please insert --,--.

Column 9, line 7, please delete "states" and insert --state,--.

Column 9, line 9, please delete "to to" and insert --to the--.

Column 9, line 19, between the words "circuit" and "wherein" please insert --,--.

Column 9, line 40, between the words "state" and "and" please insert --,--.

Column 11, line 21, please delete "circuit1" and insert --circuit,--.

Column 11, line 55, please delete "circuit" and insert --circuit,--.

Signed and Sealed this

Twenty-sixth Day of June, 2007

JON W. DUDAS
*Director of the United States Patent and Trademark Office*